(12) United States Patent
Flanders et al.

(10) Patent No.: US 9,571,119 B2
(45) Date of Patent: Feb. 14, 2017

(54) DEFEAT OF ALIASING BY INCREMENTAL SAMPLING

(71) Applicant: Raytheon Company, Waltham, MA (US)

(72) Inventors: Bradley Flanders, Whittier, CA (US); Ian S. Robinson, Redondo Beach, CA (US)

(73) Assignee: RAYTHEON COMPANY, Waltham, MA (US)

( * ) Notice: Subject to any disclaimer, the term of this patent is extended or adjusted under 35 U.S.C. 154(b) by 119 days.

(21) Appl. No.: 14/457,186

(22) Filed: Aug. 12, 2014

(65) Prior Publication Data

US 2016/0049950 A1 Feb. 18, 2016

(51) Int. Cl.
| H03M 1/12 | (2006.01) |
| H04B 1/16 | (2006.01) |
| G01R 23/16 | (2006.01) |

(52) U.S. Cl.
CPC ............... *H03M 1/128* (2013.01); *G01R 23/16* (2013.01); *H03M 1/1265* (2013.01); *H04B 1/16* (2013.01)

(58) Field of Classification Search
CPC ..... G01R 23/16; H03M 1/128; H03M 1/1265; H04B 1/16
See application file for complete search history.

(56) References Cited

U.S. PATENT DOCUMENTS

| 6,477,553 | B1 * | 11/2002 | Druck | ................. | H03M 1/1265 341/123 |
| 8,823,573 | B1 | 9/2014 | Nguyen et al. | | |
| 2004/0044715 | A1 * | 3/2004 | Aldroubi | ................. | G06T 5/001 708/490 |
| 2007/0230760 | A1 * | 10/2007 | Omi | .......................... | G06T 5/20 382/131 |
| 2008/0143573 | A1 * | 6/2008 | Luthra | ................... | H04L 27/265 341/155 |
| 2008/0246640 | A1 * | 10/2008 | Vanderhaegen | .... | H03M 1/1265 341/143 |
| 2012/0075134 | A1 * | 3/2012 | Rogers | ................... | H03M 1/128 341/155 |

(Continued)

FOREIGN PATENT DOCUMENTS

WO    WO 2008/073528 A1    6/2008

OTHER PUBLICATIONS

Applebaum, et al.; "Chirp Sensing Codes: Deterministic Compressed Sensing Measurements for Fast Recovery"; Applied & Computational Harmonic Analysis 26.2; Mar. 2009; 8 pages.

(Continued)

*Primary Examiner* — Sujatha Sharma

(57) ABSTRACT

A method includes generating a sampling signal having a non-uniform sampling interval and sampling a received signal with an analog-to-digital converter (ADC) using the sampling signal. The method also includes mapping the sampled received signal onto a frequency grid of sinusoids, where each sinusoid has a signal amplitude and a signal phase. The method further includes estimating the signal amplitude and the signal phase for each sinusoid in the frequency grid. In addition, the method includes computing an average background power level and detecting signals with power higher than the average background power level. The non-uniform sampling interval varies predictably.

20 Claims, 8 Drawing Sheets

(56) References Cited

U.S. PATENT DOCUMENTS

| | | | |
|---|---|---|---|
| 2013/0062508 A1* | 3/2013 | Kanter | H03M 1/1265 250/214 DC |
| 2013/0069807 A1* | 3/2013 | Sestok | H03M 7/00 341/110 |
| 2014/0184273 A1* | 7/2014 | Feizi-Khankandi | H03M 1/1265 327/91 |
| 2014/0232581 A1 | 8/2014 | Nguyen et al. | |

OTHER PUBLICATIONS

Applebaum, et al.: "Sparce Recovery with Non-Uniform Chirp Sampling"; Princeton University; Sep. 2008; 14 pages.

Applebaum, L.; "Coded Cornpressed Sensing with Applications to Wireless Communication"; Presented to Princeton University; Sep. 2012; 153 pages.

Bilinskis, I.; "Digital Alias-Free Signal Processing"; Chapters 3, 6, 8, 9 and 15; John Wiley & Sons; May 2007; 93 pages.

I. Mednieks, "Methods for Spectral Analysis of Nonuniformly Sampled Signals", International Conference on Sampling Theory and Application, SAMPTA 2005, Jul. 15, 2005, 4 pages.

Dongdong Qu, et al., "A Novel Spectral Estimation Method by Using Periodic Nonuniform Sampling", Conference Record of the Forty-First Asilomar Conference on Signals, Systems & Computers, Nov. 4-7, 2007, p. 1134-1138.

Notification of Transmittal of the International Search Report and the Written Opinion of the International Searching Autority, or the Declaration dated Oct. 14, 2015 in connection with International Patent Application No. PCT/US2015/035387.

\* cited by examiner

NON-UNIFORM SAMPLING INTERVALS WITH LINEAR TIME STEP INCREASE

DEFEAT OF ALIASING BY INCREMENTAL SAMPLING

TECHNICAL FIELD

This disclosure is directed in general to signal sampling. More specifically, this disclosure relates to an apparatus and method to defeat aliasing by incremental sampling, such as in extremely wideband receivers.

BACKGROUND

A variety of signal sampling techniques are known. Traditional uniform sampling techniques often limit the maximum frequency of the signal that can be recovered due to the Nyquist limit and the effect of aliasing caused by slow sampling. Techniques to defeat aliasing fall into two general categories: multiple uniform sampling techniques and non-uniform sampling techniques. There are also some hybrid techniques that have been used, such as those that use non-uniform modulation of the signal followed by uniform sampling, in an attempt to overcome the Nyquist limit and to find ways to combat the effects of aliasing. However, these techniques often require substantial hardware or computing resources to recover signals of interest in a wideband application. The resources needed to extract a signal of interest typically grow rapidly as the frequency spectrum of interest widens.

In the area of extremely wideband receivers, there is yet another class of problems that arises when looking for weaker signals in the presence of stronger signals. These problems get compounded when the weaker signals can occur anywhere within an extremely broad spectrum and are mixed with strong signals of interest. In addition, the application environment is often constrained by the availability of hardware and computing resources.

SUMMARY

This disclosure provides an apparatus and method to defeat aliasing by incremental sampling, enabling extremely wideband receivers.

In a first embodiment, an apparatus includes a signal generator configured to generate a sampling signal with a varying sampling interval having an average time step with a variation size. The apparatus also includes an analog-to-digital converter (ADC) configured to sample a received signal using the sampling signal. The varying sampling interval is a function of the average time step, the variation size, a total number of samples taken, and a current sample number relative to the total number of samples taken.

In a second embodiment, a method includes generating a sampling signal having a non-uniform sampling interval and sampling a received signal with an ADC using the sampling signal. The method also includes mapping the sampled received signal onto a frequency grid of sinusoids, where each sinusoid has a signal amplitude and a signal phase. The method further includes estimating the signal amplitude and the signal phase for each sinusoid in the frequency grid. In addition, the method includes computing an average background power level and detecting signals with power higher than the average background power level. The non-uniform sampling interval varies predictably.

In a third embodiment, a system includes a receiver front-end configured to receive a wideband signal, a signal generator configured to generate a sampling signal with a non-uniform sampling interval having an average time step with a variation size, and an ADC configured to sample the received wideband signal using the sampling signal. The system also includes at least one processing device configured to map the sampled received signal onto a frequency grid of sinusoids (each sinusoid having a signal amplitude and a signal phase), estimate the signal amplitude and the signal phase for each sinusoid in the frequency grid, compute an average background power level, and detect signals with power higher than the average background power level. The non-uniform sampling interval varies predictably.

Certain embodiments may provide various technical advantages depending on the implementation. For example, a technical advantage of some embodiments may include the ability to provide an adjustable, deterministic, non-uniform sampling grid that can be tuned to fit the nature of an application. Pre-computations of sinusoids can be limited to selected points in the frequency grid to suit pockets of bands of interest in the spectrum. Certain embodiments can also substantially reduce the computational power needed by appropriate selection of frequency grid spacings and adjusting the non-uniform sampling grid spacings. Certain embodiments can further use simpler clock structures to obtain the non-uniform sampling of the signal.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of this disclosure and its advantages, reference is now made to the following description taken in conjunction with the accompanying drawings, in which like reference numerals represent like parts.

DETAILED DESCRIPTION

Figure 1:
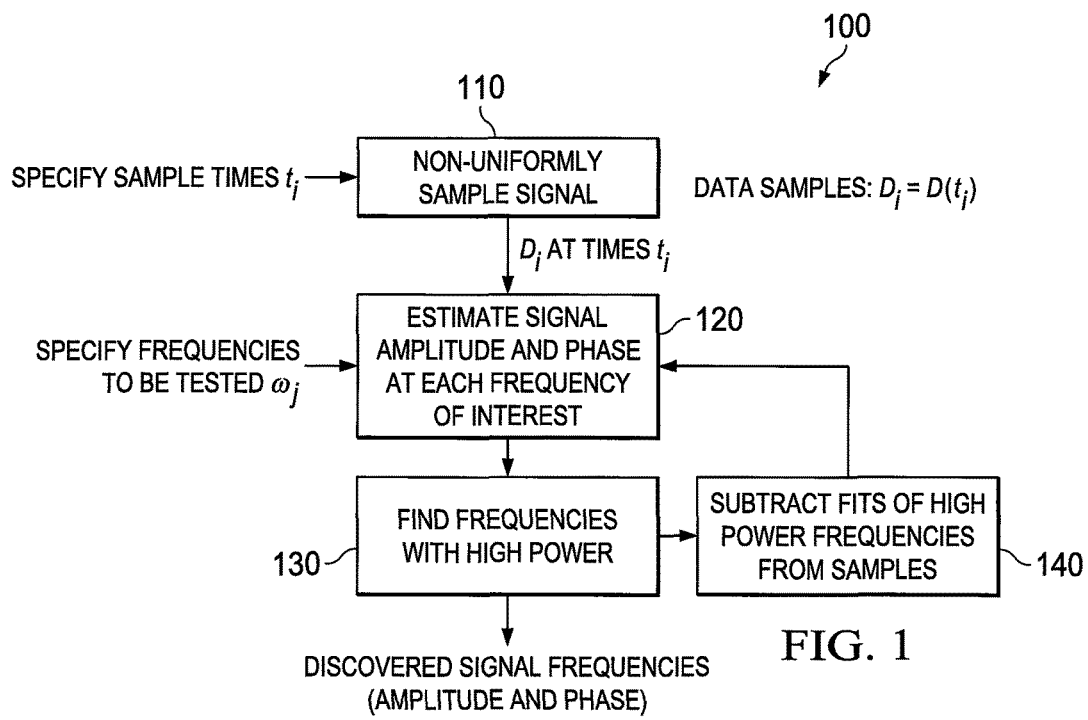
FIG. 1 illustrates an example flow diagram of a method for defeating aliasing by incremental sampling according to this disclosure.

FIGS. 1 through 9, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

The development of extremely wideband receivers often focuses on solving the problem of searching for unknown signals. With uniform sampling techniques, the maximum frequency of a signal that can be detected is the Nyquist limit, since signals at higher frequencies will alias into the Nyquist band, giving spurious detections. Multiple approaches have been attempted in the past to solve this problem, but those approaches have various drawbacks. For example, running high data rate samplers adds substantial cost, and using multiple uniform samplers are very ambiguous in a multi-signal environment. Also, running multiple bandpass receivers, one per Nyquist zone, often requires a lot of hardware, is power intensive, and is expensive. Most non-uniform sampling techniques use random sampling with complex and computationally intensive compressive sensing approaches for frequency determination, which often require complex sampling signals and expensive hardware and computational resources.

In accordance with this disclosure, an approach is disclosed for defeating aliasing. In some embodiments, incremental sampling is used with frequency determination techniques to defeat aliasing in real-time processing of signals. These embodiments do not require very fast sampling systems. For example, the average time interval of the samples may be 10-20 times larger than the Nyquist sample time intervals. In particular embodiments, maximum and minimum sample intervals are vary from 50% larger to 50% smaller than the average sampling interval. Frequency determination is accomplished by fitting a sine and cosine at each frequency of interest to the sampled data at the known non-uniform time spacings. These embodiments do not require large computational resources because the use of deterministic time spacings allows for pre-computing sinusoids for faster real-time processing of signals. Amplitude, power and phase of the signals of interest can be quickly calculated in real-time after a simple matrix multiplication, whose dimensions are the number of frequencies times the number of time points, is used to calculate the fitting coefficients of the respective sines and cosines. The frequencies with the highest power determine the signals of interest. In addition, strong signals can be characterized and subtracted out of the data samples already taken iteratively, and the residues of the data samples are then reprocessed to find weak signals.

Next-generation Electronic Warfare (EW) systems and other systems often use extremely wideband receivers. The proposed techniques provide unique mission capabilities to modern EW systems to handle increasingly agile threats that require the EW systems to "stare" at all frequencies rather than scanning across a spectrum. Such a mission capability normally requires unaffordable scaling of a number of receivers. In addition, the proposed techniques extend the bandwidth of low cost Analog-to-Digital Converters (ADCs) and reduce, eliminate, or simplify signal tuners in the design of wideband receivers.

FIG. 1 illustrates an example flow diagram of a method 100 for defeating aliasing by incremental sampling according to this disclosure. In step 110, a user specifies a method of non-uniform sampling, yielding sample times $t_i$ at which a received signal will be sampled. Multiple embodiments are available to determine non-uniform sampling times $t_i$. The sampling yields a data sample $D_i$ for each sample time $t_i$. The data samples are used at step 120 where processing is done on the data samples $D_i$ to estimate the amplitude and phase at each frequency of interest. The application environment can dictate the frequency bands of interest, from which a frequency grid can be generated. In some embodiments, sinusoids are superimposed in the frequency grid to form the signal(s) of interest. Amplitude and phase values of these sinusoids can be calculated for each frequency in the grid.

At step 130, a search is made for frequencies with higher power. Several search techniques and embodiments are available to extract signals of interest with their amplitudes, phases, and power values computed. Once a high power signal is detected and extracted, weaker signals can be found. At step 140, the detected high power signals are subtracted from the samples, and new samples are computed. The new samples are fed back to step 120, and the process repeats until weak signals are detected and extracted.

Figure 2:
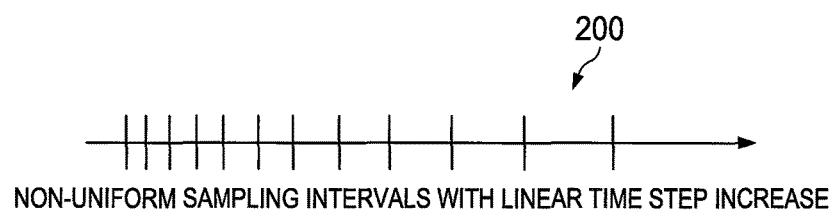
FIG. 2 illustrates an example non-uniform sampling with linear time steps according to this disclosure.

This technique supports various methods of non-uniform sampling. For example, in some embodiments, a linear increase or decrease in the time step between two bounds can be used. FIG. 2 illustrates an example non-uniform sampling 200 with linear time steps according to this disclosure. In this example, the sampling time $\Delta t_i$ is given by:

$$\Delta t_n = dt\left(1 - f + 2f\frac{n}{n_{max}}\right)$$

where dt represents the average time step, f represents the variation size, n represents the current sample number, and $n_{max}$ represents the total number of samples (which is typically an integer multiple of 512).

As an example, when the average time step dt and the variation size f is selected by the user, the resulting sampling interval varies from (1−f)*dt to (1+f)*dt. By selecting f=0.5, the sampling time spacing varies from 0.5 to 1.5 dt. Also, the average time step dt can be less than or equal to ten times the Nyquist sampling time as evidenced by the results of simulation. Many variations of this method of determining sampling time can be envisioned by one in the art, and these variations are encompassed by this disclosure. Other embodiments could include uniform time steps with random but known variations in step sizes within specified minimum and maximum step sizes. There can be still other embodiments with arbitrary sets of non-uniform sample times but with known time steps.

The inputs received by the method 100 could be obtained from a user or from an application before determining the parameters of the non-uniform sampling and arriving at the sample times $t_i$. For example, in some embodiments where linear time step increases are used, an application can specify the average time step and the variation size. The data can then be sampled at these deterministic but non-uniform time intervals $t_i$ in order to acquire the data samples $D_i$ at the sample times $t_i$.

Before the data samples $D_i$ are processed, the frequency grid can be established from the frequency bands of interest, which is often dictated by the application needs. The user or the application can also input a desired frequency resolution $\Delta f$ that is used with the desired frequency band to formulate the frequency grid. For example, if the band of interest is $f_1$ to $f_2$ and the desired frequency resolution is $\Delta f$, selected frequency points in the grid could be $f_1 + 2\Delta f$, and so on until f2 is reached.

Figure 3:
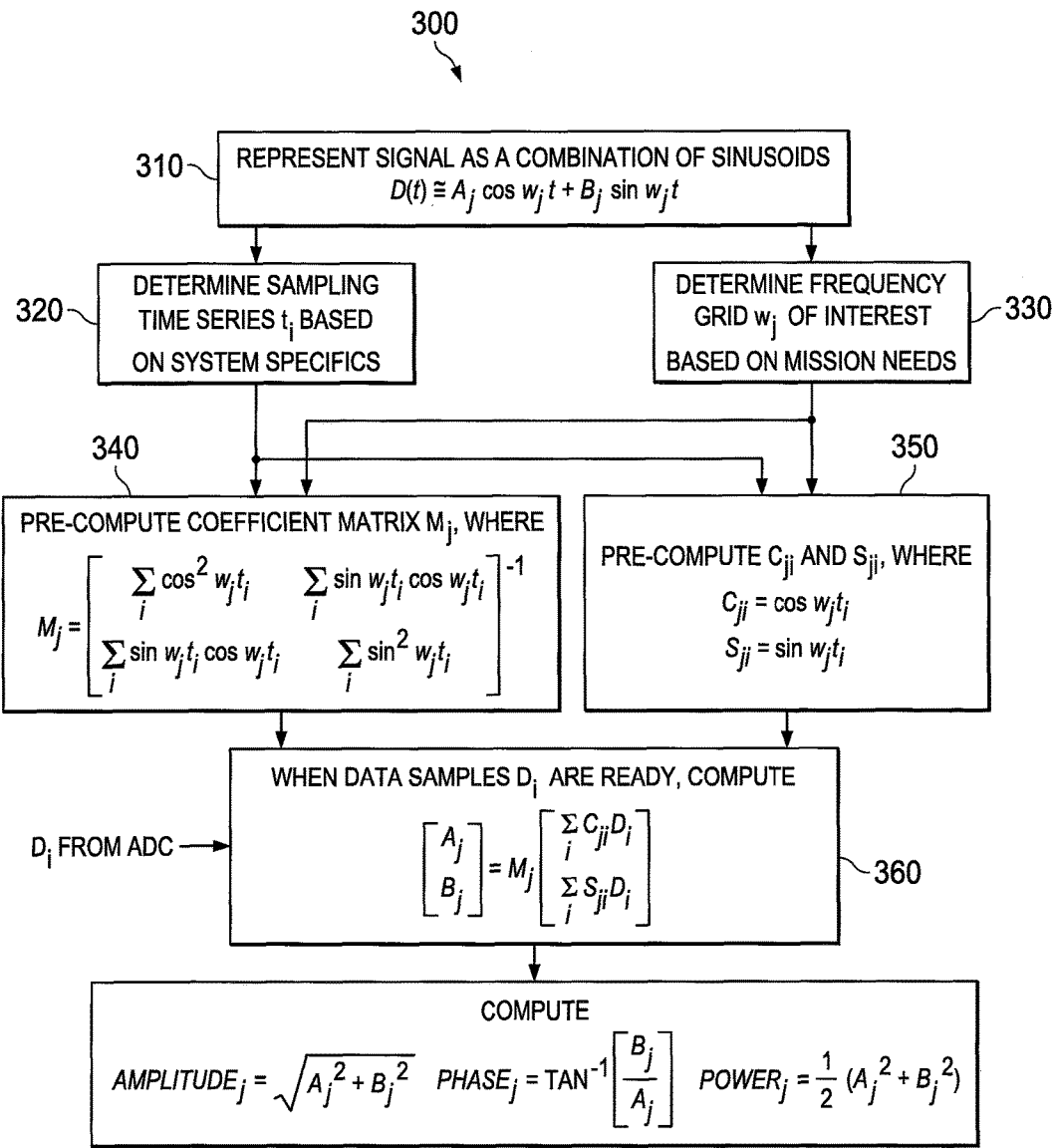
FIG. 3 illustrates an example flow diagram of a method for extracting signal amplitude and phase at each frequency of interest according to this disclosure.

FIG. 3 illustrates an example flow diagram of a method 300 for extracting signal amplitude and phase at each frequency of interest according to this disclosure. The method 300 can be used to estimate the signal amplitude and phase at each frequency $f_j$ in the frequency grid. The angular frequency $w_j$ is $2\pi f_j$. As shown in step 310, sinusoidal waveforms of varying frequencies are fit on the sampled data, which could be expressed as:

$$D(t) \approx A_j \cos w_j t + B_j \sin w_j t$$

Based on system needs, the sampling time series $t_i$ is set in step 320. Based on the mission, frequencies for the signals of interest are determined, and a frequency grid of $w_j(2\pi f_j)$ is created in step 330. One advantage of this approach is that the sinusoids in this function can be pre-computed and reused with each data set $D_i$. Once the sampling times $t_i$ and the frequency grid $w_j$ are set, a coefficient matrix $M_j$ is determined at step 340, and cosine and sine functions $C_{ji}$ and $S_{ji}$ are determined at step 350. These values can be pre-computed as follows:

$$M_j = \begin{pmatrix} \sum_i \cos^2 w_j t_i & \sum_i \sin w_j t_i \cos w_j t_i \\ \sum_i \sin w_j t_i \cos w_j t_i & \sum_i \sin^2 w_j t_i \end{pmatrix}^{-1}$$

$$C_{ji} = \cos w_j t_i$$

$$S_{ji} = \sin w_j t_i$$

Pre-computing can substantially accelerate real-time fitting of $A_j$ and $B_j$ as a simple fast matrix multiplication and can be computed in one step when the samples $D_i$ arrive at step 360. This can be expressed as follows:

$$\begin{pmatrix} A_j \\ B_j \end{pmatrix} = M_j \begin{pmatrix} \sum_i C_{ji} D_i \\ \sum_i S_{ji} D_i \end{pmatrix}$$

Once the $A_j$ and $B_j$ values are computed from the above matrix, the amplitude, phase, and power values are computed at step 370. This can be expressed as follows:

$$Amplitude_j = \sqrt{A_j^2 + B_j^2}$$

$$Phase_j = \tan^{-1}\left(\frac{B_j}{A_j}\right)$$

$$Power_j = \frac{1}{2}(A_j^2 + B_j^2)$$

Figure 4:
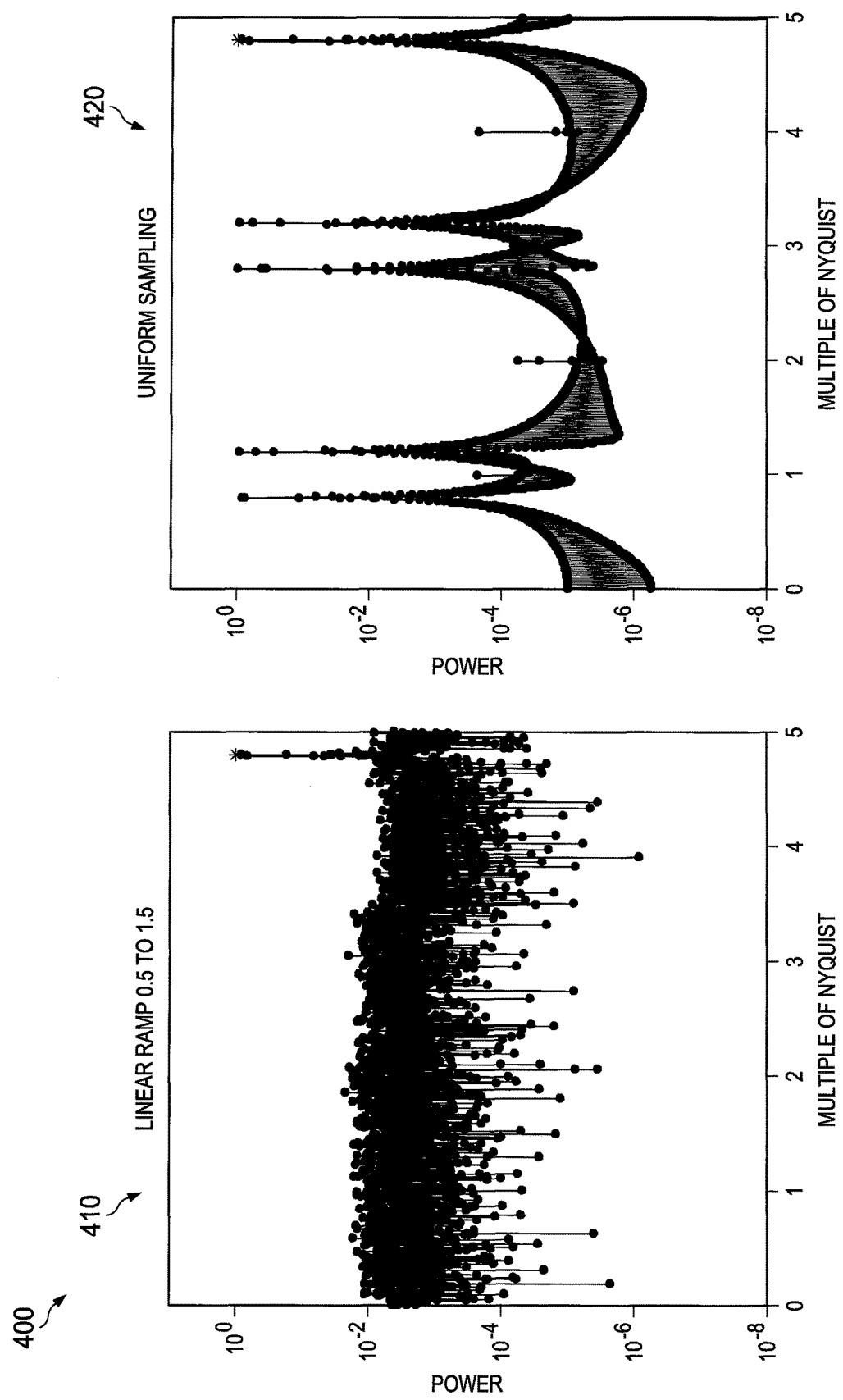
FIG. 4 illustrates an example comparison of different techniques for defeating aliasing according to this disclosure.

A side effect of non-uniform sampling is the formation of background structure in the power spectral density (PSD). FIG. 4 illustrates an example comparison of the PSD different sampling techniques, including a technique for defeating aliasing according to this disclosure. In FIG. 4, a graph 410 shows the PSD result for non-uniform sampling (in particular a linear ramp 0.5 f to 1.5 f of sampling times), and a graph 420 shows the PSD result for uniform sampling. The results shown are for a single pure sine wave (single tone) input whose frequency and power is denoted by the red star. The effects of aliasing can be clearly seen in 420, because the frequency is higher than Nyquist for the uniform sampler. The higher background in graph 410 is clear by comparing the PSD levels to the low background levels between the alias spikes in graph 420. Graph 410 demonstrates that a strong signal above Nyquist can be unambiguously determined; however a method for accurate strong signal removal must be used to remove this high background structure to detect weak signals in the presence of strong signals.

FIGS. 5 through 8 illustrate an example sequential removal of signals to find weak signals mixed with strong signals according to this disclosure. Other methods may be known to one in the art to detect weak signals mixed with strong signals, and these methods can also be used. In the proposed method shown in FIGS. 5 through 8, the power spectral density of the received signal is calculated at the specified frequency grid. Once calculated, a search is done for frequencies in the selected frequency grid with power exceeding the background power level by a specified amount or by a specified factor. The detected signals are specified with a set of $A_j$ and $B_j$ (amplitude$_j$ and phase) values at these frequencies with high power signal content.

The next step involves subtracting the fitted high power frequency from the samples. To do this, time variations of the detected signal are reconstructed in terms of amplitudes of constituting sinusoids at high frequency. For example, for a single frequency signal, j, reconstruction can be expressed as:

$$R_i = A_j \cos w_j t_i + B_j \sin w_j t_i.$$

For multiple frequencies, the reconstruction can be given by summing over the set of frequencies j and properly normalizing the sum:

$$R_i = N^* \Sigma (A_j \cos w_j t_i + B_j \sin w_j t_i).$$

After that, a residue signal can be obtained by subtracting this reconstruction from the data samples Di as follows:

$$Resid_i = D_i - R_i.$$

This residual signal is fed back, and the process is repeated. The residual is analyzed to find additional signals by repeating the sine/cosine fitting. The strong signals are eliminated before the weak signals are found, and the process can be repeated until all signals are found. There are multiple ways to detect when to stop this chain of iterations. The settings of the power thresholds can be done in any suitable manner and could be throttled based on the type of application environment. Other techniques may be known to one of ordinary skills to determine when to effectively stop this iterative process.

In other embodiments, one frequency at a time could be found. This technique can detect the frequency with the maximum power level, which is characterized by $A_j$ and $B_j$. In still other embodiments, signal templates may be used, such as when the maximum frequency and shape of the power spectral distribution (PSD) near the maximum is detected and the PSD near the maximum power is fit to templates of various signal types (such as sinusoid or frequency modulation). The detected signals can be defined as the best matching template that is scaled to the calculated PSD values near the maximum power. The iterations can be stopped when the PSD of the residual has no frequencies above the selected power threshold or when a maximum number of iterative cycles have been executed to avoid large processing times.

The removal of the background helps in the detection of weaker signals in the non-uniform sampling techniques, such as the ones presented here. The PSD shows the elevated background when strong signals are present, and additional processing as detailed earlier can be used to successfully remove the background. The process allows computation of the amplitudes and phases of these strong signals that are above the average background level. Once done, the fitted sines and cosines are subtracted from the original samples. When reprocessed, this reveals a significantly lower background, and the iterations continue as needed. Subsequent iterations reveal weaker signals as the level of the background substantially gets reduced after each iteration.

Figure 5:
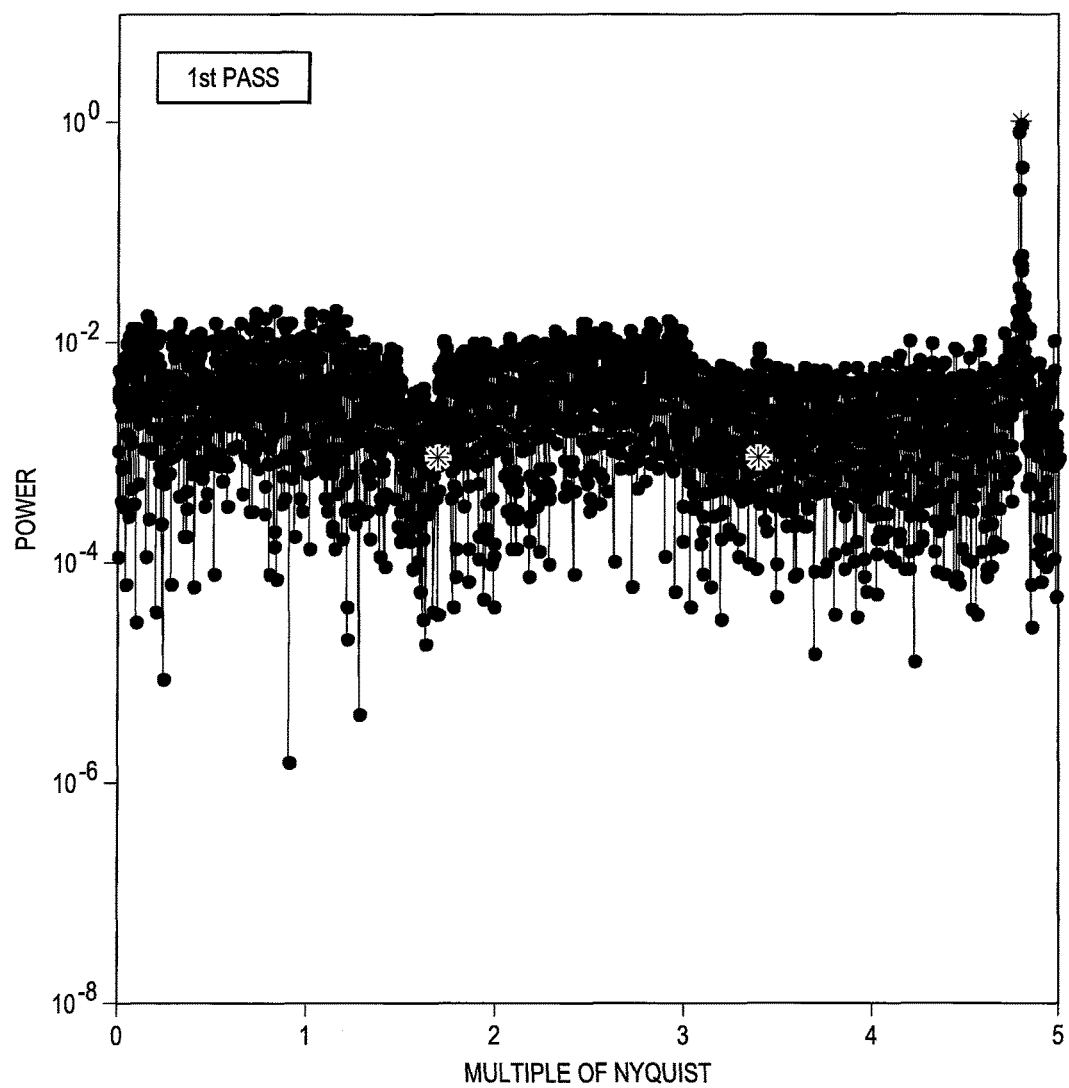
FIGS. 5 through 8 illustrate an example sequential removal of signals to find weak signals mixed with strong signals according to this disclosure.
Figure 6:
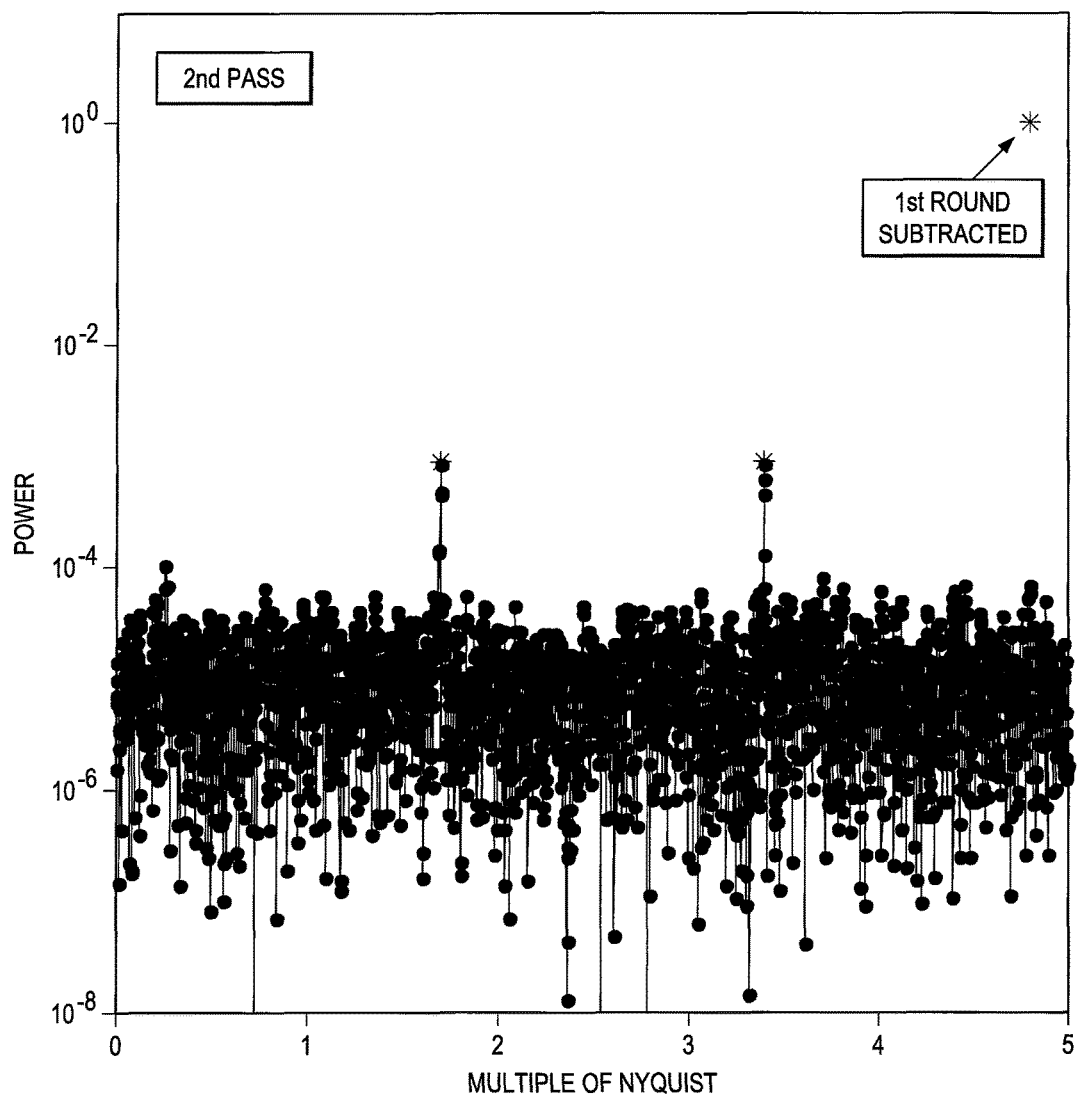
Figure 7:
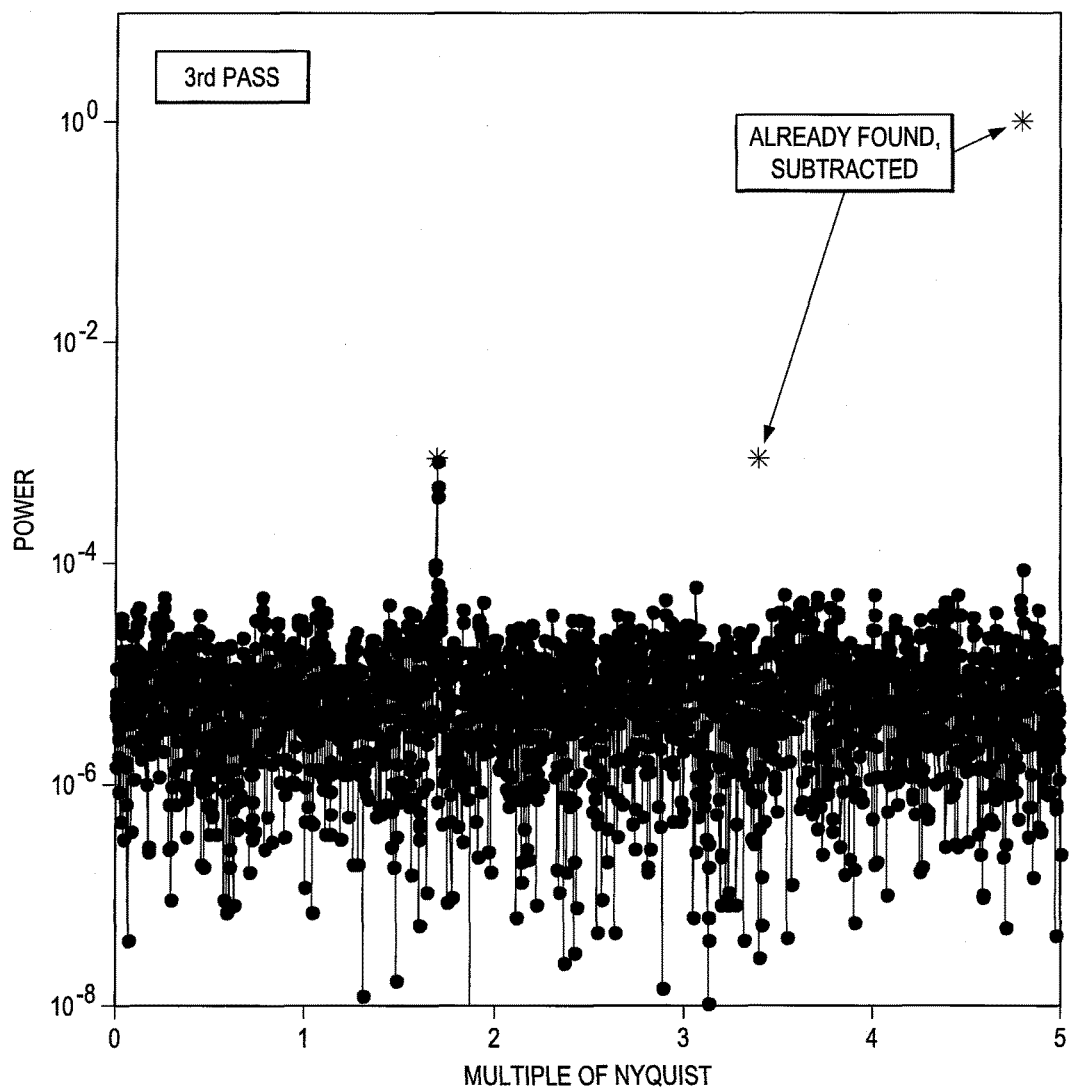
Figure 8:
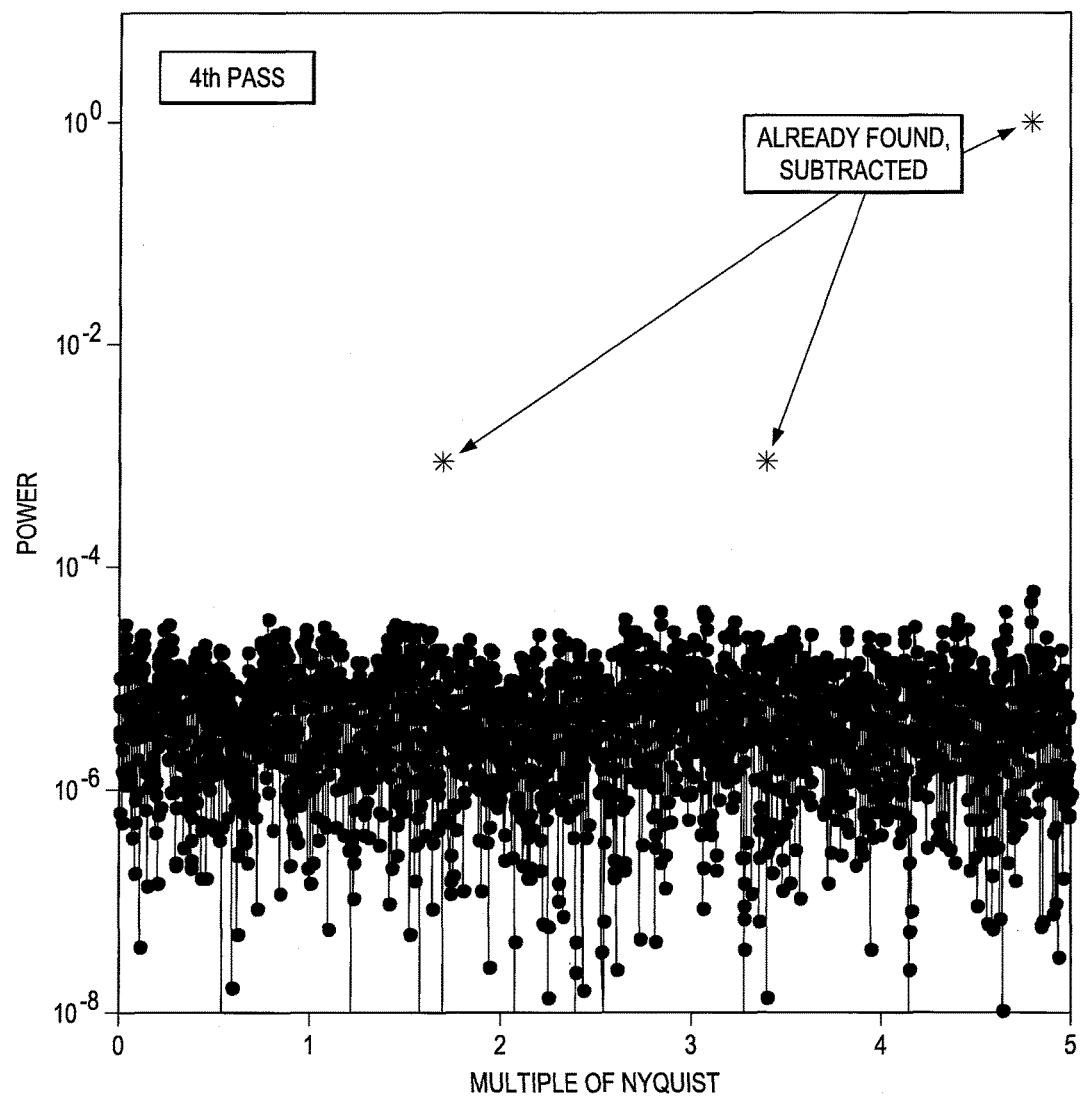

FIG. 5 illustrates an example first iteration of this process. The detected high power signal in the first round (denoted by reference number 502) is subtracted, and the residue 602 is illustrated in FIG. 6. In the second pass shown in FIG. 6, the background is at a substantially lower power level compared to the first pass (now at approximately $10^{-4}$ compared to the earlier $10^{-2}$). This reveals two more weak signals (denoted by reference numbers 604-606) that were not earlier visible. The third iteration continues after removing one of these weak signals 606 to generate the residuals 702 shown in FIG. 7, and the third signal 604 is subtracted to yield the residuals 802 shown in FIG. 8. Each iterative cycle takes the background to lower power levels, and this process reveals weaker signals that were buried in the earlier background. The iteration can continue until all signals of interest are extracted or the iterations are stopped.

Figure 9:
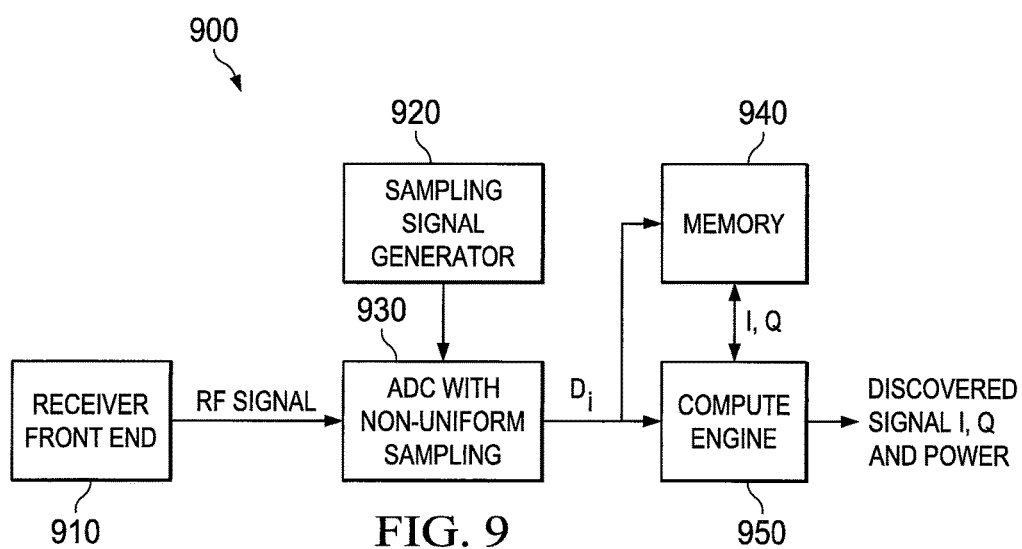
FIG. 9 illustrates an example architecture for an extremely wideband receiver according to this disclosure.

FIG. 9 illustrates an example architecture for an extremely wideband receiver 900 according to this disclosure. The wideband receiver 900 here implements the technique described above to defeat aliasing using incremental sampling. The system 900 includes a receiver front-end 910 that captures wideband signals and sends the signals to an ADC 930. The ADC's sampling is controlled by a signal generator 920, which generates a non-uniform sampling signal that controls the ADC 930.

The sampled data $D_i$ (and subsequent residue samples) are stored in a memory 940. The sampled data can also be stored externally or fed in real-time to a compute engine 950. The memory 940 could represent any suitable volatile or volatile storage and retrieval devices. The compute engine 950 can perform the iterative process described above. The compute engine 950 could represent at least one microprocessor, microcontroller, digital signal processor, application specific integrated circuit, field programmable gate array, discrete logic devices, or other processing or computing devices. The compute engine 950 could operate using the samples stored in the memory 940 or received in real-time and implement the algorithm outlined above. Various variations of receiver designs can be envisioned by one of ordinary skill in the art to implement the concepts presented in this document, and such systems are encompassed by this disclosure.

Although FIGS. 1 through 9 illustrate example details for defeating aliasing using incremental sampling, various changes may be made to FIGS. 1 through 9. For example, while shown as a series of steps, various steps in the methods could overlap, occur in parallel, occur in a different order, or occur any number of times. Also, the non-uniform sampling shown in FIG. 2 is an example only, and the signals shown in FIGS. 4 through 8 are examples only. In addition, the methods described above could be implemented in any suitable device or system and are not limited to the device shown in FIG. 9.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

To aid the Patent Office and any readers of any patent issued on this application in interpreting the claims appended hereto, the applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. An apparatus comprising:
   a signal generator configured to generate a sampling signal with a varying sampling interval having an average time step with a variation size; and
   an analog-to-digital converter (ADC) configured to sample a received signal using the sampling signal;
   wherein the varying sampling interval is a function of the average time step, the variation size, and a ratio of a current sample number relative to a total number of samples taken;
   wherein the varying sampling interval is defined by:

$$\Delta t_n = dt\left(1 - f + 2f\frac{n}{n_{max}}\right)$$

wherein n is the current sample number having a sampling interval $\Delta t_n$, dt is the average time step, f is the variation size, and $n_{max}$ is the total number of samples.

2. The apparatus of claim 1, wherein the variation size has a value of 0.5.

3. The apparatus of claim 1, wherein the total number of samples has a value that is an integer multiple of 512.

4. The apparatus of claim 1, further comprising at least one processing device configured to:
map the sampled received signal onto a frequency grid of sinusoids, each sinusoid having a signal amplitude and a signal phase;
estimate the signal amplitude and the signal phase for each sinusoid in the frequency grid;
compute an average background power level; and
detect signals with power higher than the average background power level.

5. The apparatus of claim 4, wherein the at least one processing device is further configured to:
remove the signals with the power higher than the average background power level from the sampled received signal; and
repeat the map, estimate, compute, and detect operations.

6. The apparatus of claim 1, wherein the average time step dt is less than or equal to ten times a Nyquist sampling time.

7. A method comprising:
generating a sampling signal with a non-uniform sampling interval having an average time step with a variation size;
sampling a received signal with an analog-to-digital converter (ADC) using the sampling signal;
mapping the sampled received signal onto a frequency grid of sinusoids, each sinusoid having a signal amplitude and a signal phase;
estimating the signal amplitude and the signal phase for each sinusoid in the frequency grid;
computing an average background power level; and
detecting signals with power higher than the average background power level;
wherein the non-uniform sampling interval varies predictably;
wherein the non-unifoun sampling interval is a function of the average time step, the variation size, and a ratio of a current sample number relative to a total number of samples taken;
wherein the non-uniform sampling interval is defined by:

$$\Delta t_n = dt\left(1 - f + 2f\frac{n}{n_{max}}\right)$$

wherein n is the current sample number having a sampling interval $\Delta t_n$, dt is the average time step, f is the variation size, and $n_{max}$ is the total number of samples.

8. The method of claim 7, wherein the non-uniform sampling interval increases linearly.

9. The method of claim 7, wherein the non-uniform sampling interval has a step size that varies within specified minimum and maximum values.

10. The method of claim 7, wherein the variation size f has a value of 0.5.

11. The method of claim 7, wherein the total number of samples $n_{max}$ has a value that is an integer multiple of 512.

12. The method of claim 7, wherein detecting the signals with the power higher than the average background power level comprises finding one frequency at a time that has a highest power.

13. The method of claim 7, wherein detecting the signals with the power higher than the average background power level comprises finding a maximum frequency and a shape of a power spectral distribution (P SD) near the maximum frequency and using the PSD to detect a portion of the signals that best matches a PSD template.

14. The method of claim 7, further comprising:
removing the signals with the power higher than the average background power level from the sampled received signal; and
repeating the mapping, estimating, computing, and detecting operations.

15. The method of claim 7, wherein the average time step dt is less than or equal to ten times a Nyquist sampling time.

16. A system comprising:
a receiver front-end configured to receive a wideband signal;
a signal generator configured to generate a sampling signal with a non-uniform sampling interval having an average time step with a variation size;
an analog-to-digital converter (ADC) configured to sample the received wideband signal using the sampling signal; and
at least one processing device configured to:
map the sampled received signal onto a frequency grid of sinusoids, each sinusoid having a signal amplitude and a signal phase;
estimate the signal amplitude and the signal phase for each sinusoid in the frequency grid;
compute an average background power level; and
detect signals with power higher than the average background power level;
wherein the non-uniform sampling interval varies predictably;
wherein the non-uniform sampling interval is a function of the average time step, the variation size, and a ratio of a current sample number relative to a total number of samples taken;
wherein the non-uniform sampling interval is defined by:

$$\Delta t_n = dt\left(1 - f + 2f\frac{n}{n_{max}}\right)$$

wherein n is the current sample number having a sampling interval $\Delta t_n$, dt is the average time step, f is the variation size, and $n_{max}$ is the total number of samples.

17. The system of claim 16, wherein the at least one processing device is further configured to:
remove the signals with the power higher than the average background power level from the sampled received signal; and
repeat the map, estimate, compute, and detect operations.

18. The system of claim 16, wherein the non-uniform sampling interval increases linearly.

19. The system of claim 16, wherein the non-uniform sampling interval has a step size that varies within specified minimum and maximum values.

20. The system of claim 16, wherein:
the variation size f has a value of 0.5;
the total number of samples $n_{max}$ has a value that is an integer multiple of 512; and
the average time step dt is less than or equal to ten times a Nyquist sampling time.

* * * * *